United States Patent [19]

Williams

[11] Patent Number: 5,448,337
[45] Date of Patent: Sep. 5, 1995

[54] METHOD AND APPARATUS FOR DETERMINING THE CHARGE OR VOLTAGE DISTRIBUTION OF AN ELECTROPHOTOGRAPHIC SURFACE

[76] Inventor: Bruce T. Williams, 54 Jesson Pkwy., Lockport, N.Y. 14094

[21] Appl. No.: 264,440

[22] Filed: Jun. 23, 1994

[51] Int. Cl.⁶ .............................................. G03G 21/00
[52] U.S. Cl. ..................................... 355/203; 324/456; 355/208
[58] Field of Search ................ 355/246, 203, 208, 216, 355/219; 324/452, 454, 458, 71.1

[56] References Cited

U.S. PATENT DOCUMENTS 5,101,159  3/1992  Bossard.
5,119,030  6/1992  Bossard et al. ...................... 324/456
5,182,596  1/1993  Nakazawa et al. ................... 355/203

*Primary Examiner*—Matthew S. Smith
*Attorney, Agent, or Firm*—Hodgson, Russ, Andrews, Woods & Goodyear

[57] ABSTRACT

A high spatial resolution low noise method and apparatus for determining electrical characteristics such as the voltage density distribution or the charge density distribution of an electrophotographic medium having a surface and capable of holding electrical charge wherein a sensor is provided in close proximity to the surface, electrical charge is applied to the surface, relative movement is caused between the surface and an edge of the sensor, a substantially zero voltage difference is maintained between the sensor and the surface, there is detected a signal induced on the sensor edge in response to variation in the voltage or charge on the surface as it crosses the sensor edge, and an electrical parameter of the signal is measured to provide information on the variation of the voltage or charge on the surface to determine the voltage density distribution or the charge density distribution on the surface. The foregoing eliminates the requirements of selecting a sensor area to be sufficiently small and holding the spacing between sensor and surface constant to reduce noise, while obtaining the advantages of increased signal strength and increased measurement resolution.

49 Claims, 5 Drawing Sheets the charge on the surface to be measured, and which would produce high spatial resolution capability of the measurement. The actual minimum spacing which can be allowed by the prior method and apparatus referenced above also has to be based on the allowance for unstable distance variation due to machine operation and mechanical wear, in view of the Paschen constraint.

It would, therefore, be highly desirable to provide such a method and apparatus which eliminates the requirements of selecting a sensor area to be sufficiently small and holding the spacing between sensor and drum constant to reduce noise, while obtaining the advantages of increased signal strength and increased measurement resolution.

METHOD AND APPARATUS FOR DETERMINING THE CHARGE OR VOLTAGE DISTRIBUTION OF AN ELECTROPHOTOGRAPHIC SURFACE

BACKGROUND OF THE INVENTION

This invention relates to the electrostatic measurement art, and more particularly to a new and improved method and apparatus for determining the charge or voltage distribution of an electrophotographic surface.

One area of use of the present invention is in determining the charge or voltage distribution and ultimately the surface quality and uniformity of an electrophotographic surface such as the surface of a photoconductive drum used in photocopiers, although the principles of the present invention can be variously applied to inspecting any surface capable of holding electrical charge. In the past, photoconducting drums have been inspected visually or by light scattering techniques to determine the presence of surface defects such as holes. Recently, there has been provided a method and apparatus for quickly and reliably determining the physical quality and uniformity of a charged surface in a manner providing a measure of the charge properties of the surface. Such method and apparatus is disclosed in U.S. Pat. No. 5,101,159 issued Mar. 31, 1992, the disclosure of which is hereby incorporated by reference, and the method and apparatus has the capability of determining the size, number and location of surface defects. In such method and apparatus, important considerations are minimizing electrical noise and maximizing resolution of detected signals. These considerations, in turn, lead to the requirements of selecting the area of the sensor to be sufficiently small so as to minimize electrical noise when the sensor is in close proximity to the surface, and of maintaining a constant distance between the sensor and the surface during relative movement therebetween so that the current in the sensor is proportional only to the change in voltage along the surface and the speed at which the surface change variation crosses the edge of the sensor.

In the approach taught in U.S. Pat. No. 5,101,159, the requirement of making the sensor of sufficiently small area and the requirement to maintain a constant distance between the sensor and drum surface requires the use of expensive techniques for manufacturing the sensors while requiring the use of expensive precision mechanical machine components which require frequent maintenance to hold constant the sensor to drum distance. For example, the mechanical system which holds the drum and produces drum motion is subject to wear which produces subsequent eccentric drum rotation and mechanical noise which will produce motion in the distance between the sensor and drum while mechanically generated vibrations produced on the sensor board will produce relative motion between the sensor and drum.

Due to the introduction of charge on the drum surface during testing, a voltage in the order of 500 to 1000 volts is produced on the drum surface relative to the ground referenced potential of the sensor electrode(s). This requires that a minimum distance be established and maintained therebetween to prevent arc-over and subsequent damage to the sensor or drum. This minimum distance, as establish by the well known Paschen rule for arc-over spacings, dictates a spacing which is greater than that which would be desired to produce high signal strength for any value of non-uniformity of

SUMMARY OF THE INVENTION

It is, therefore, a primary object of the present invention to provide a new and improved method and apparatus for determining the charge or voltage distribution of an electrophotographic surface.

It is a further object of this invention to provide such a method and apparatus which eliminates the requirement of selecting a sensor area to be sufficiently small so as to minimize electrical noise when the sensor is in close proximity to the surface.

It is a further object of this invention to provide such a method and apparatus which eliminates the requirement of maintaining a constant distance between the sensor and the surface during relative movement therebetween so that the current in the sensor is proportional only to the change in voltage along the surface and the speed at which a surface charge variation passes the sensor.

It is a further object of this invention to provide such a method and apparatus which accomplishes the foregoing in a manner which obtains the advantages of increased signal strength and increased measurement resolution.

It is a further object of this invention to provide such a method and apparatus which allows for close spacing between sensor and surface without the occurrence of arc-over.

The present invention provides a high spatial resolution low noise method and apparatus for determining electrical characteristics such as the voltage density distribution or the charge density distribution of an electrophotographic medium having a surface and capable of holding electrical charge wherein a sensor is provided in close proximity to the surface, electrical charge is applied to the surface, relative movement is caused between the surface and an edge of the sensor in a direction generally tangent or parallel to the surface, a substantially zero voltage difference is maintained between the sensor and the surface, there is detected a signal induced on the sensor edge in response to variation in the voltage or charge on the surface as it crosses the sensor edge, and an electrical parameter of the signal is measured to provide information on the variation of the voltage or charge on the surface to determine the voltage density distribution or the charge density distribution on the surface. The electrophotographic medium comprises at least an electrical charge retaining first layer and an electrically conductive second layer, the electrical charge is applied to the first layer to produce a first voltage or charge on the first layer in reference to the second layer, and the aforementioned substantially zero voltage difference maintained between the sensor and surface is provided by applying to the second layer a second voltage or charge so that upon relative movement between the first layer and the edge of the sensor, no signal will be produced on the sensor edge in response to the first voltage or charge on the first layer. The application of the second voltage or charge can be performed by sensing the voltage or charge on the first layer prior to passing the sensor edge and providing the second voltage or charge as determined by the nature of the sensed voltage or charge utilizing a feedback control. An offset signal can be provided to vary the magnitude of the second voltage or charge to compensate for any change in the voltage or charge on the first layer during the time between the sensing of the voltage or charge and the passing the edge of the sensor, the offset signal depending upon the speed of relative movement between the surface and the edge of the sensor and the decay of charge or voltage on the first layer due to the dark decay characteristic thereof. The application of electrical charge to the first layer can be coordinated with the provision of the second voltage or charge as determined by the nature of the sensed voltage or charge on the first layer. The foregoing eliminates the requirements of selecting a sensor area to be sufficiently small and holding the spacing between sensor and surface constant to reduce noise, while obtaining the advantages of increased signal strength and increased measurement resolution.

The foregoing and additional advantages and characterizing features of the present invention will become clearly apparent upon a reading of the ensuing detailed description together with the included drawing wherein:

BRIEF DESCRIPTION OF THE DRAWING FIGURES

DETAILED DESCRIPTION OF THE ILLUSTRATED EMBODIMENT

Figure 1:
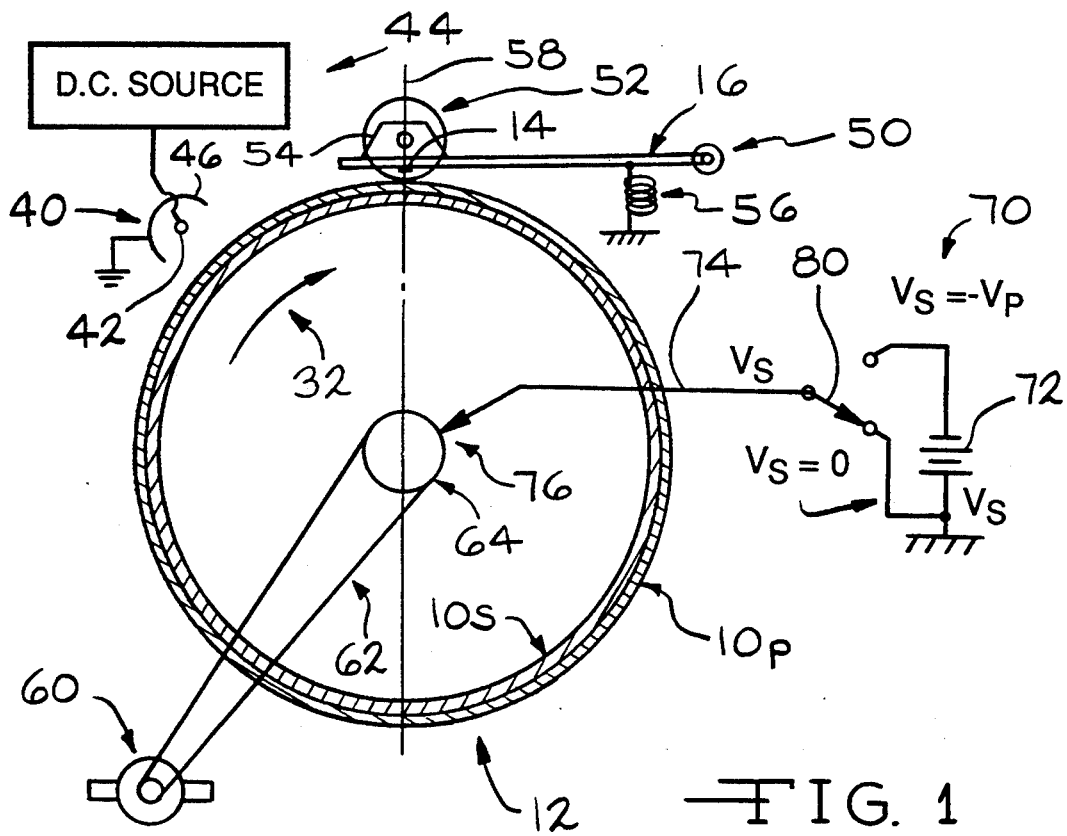
FIG. 1 is a schematic diagram illustrating the method and apparatus according to the present invention.

FIG. 1 illustrates the method and apparatus according to the present invention for determining the charge or voltage distribution of an electrophotographic surface. In the present illustration the electrophotographic surface is defined by a photoconductive drum 12 of the type employed in photocopiers which is shown in cross-section in FIG. 1. Drum 12 has a surface comprising two separate components: a normally somewhat rigid substrate layer 10s and a photosensitive film layer 10p deposited or coated on the substrate. The apparatus according to the present invention comprises at least one sensor in the form of a sensing electrode 14 and means 16 in the form of a circuit board for locating electrode 14 in close proximity to surface 10. As shown more clearly in FIG. 2, electrode 14 has an edge 18 and is disposed so that upon relative movement between surface 10 and electrode 14, electrical charge on surface 10 crosses edge 18 of electrode 14.

The electrode supporting and locating means 16 is in the form of a printed circuit board which is rectangular in overall shape having a length commensurate with the axial length of drum 12 or corresponding dimension of any other surface being inspected, and having a width sufficient to accommodate circuit components on the side opposite electrode 14. Electrode 14 can be formed on the surface of board 16 by deposition etching or other suitable techniques well-known to those skilled in the art. For inspecting most surfaces, the apparatus of the present invention includes a plurality of sensing electrodes each like electrode 14 and arranged in a path extending in a direction generally crosswise of the direction of relative movement between the electrodes and the surface as described in detail in the aforementioned U.S. Pat. No. 5,101,159.

The apparatus of the present invention further comprises means 40 for applying electrical charge to the surface being inspected. In the illustrative arrangement of FIG. 1 for determining the charge or voltage distribution of the surface of drum 12, charging means 40 typically comprises a charging electrode in the form of a wire 42 extending longitudinally along and in closely spaced parallel relation to drum surface 10, a source of high DC voltage 44 connected electrically to wire 42 and a shield 46 located outwardly of wire 42 and typically connected electrically to ground.

There is provided an arrangement for holding board 16 and therefore sensing electrode 14 at a relatively fixed distance with respect to drum surface 10. In the arrangement shown, board 16 is pivotally movable about point 50, a roller 52 rotatably mounted on board 16 via bracket 54 contacts surface 10 and establishes a predetermined constant direction or spacing between the surface of board 16 containing electrode 14, and a biasing means in the form of spring 56 acts on board 16 urging roller 52 against surface 10. Various other mechanical arrangements can of course be employed. In the foregoing or other arrangements, wheels 52 attach to board 16 at a location such that the wheel axis lies on a line extending between the center of the sensor 14 and the center or axis of drum 12. This insures that any non-uniformities in the roundness of drum 12 will not cause changes in the spacing between sensor 14 and drum surface 10. Although it is not necessary to maintain a fixed distance between sensor 14 and surface 10 in order to reduce noise in the method and apparatus of the present invention, it is desirable nevertheless to hold the distance between sensor 14 and drum surface 10 at a very small fixed amount, for example approximately 50 micrometers, in order to realize the high sensitivity and high spatial resolution capability of the measurement.

There is also provided means for causing relative movement between surface 10 and sensor 14. In the arrangement shown surface 10 is moved and to this end drum 12 is rotated by means including a drive motor 60 drivingly coupled through a belt 62 to a shaft 64 upon which drum 12 is mounted for rotation. Various other mechanical drive arrangements can of course be employed. While in the present illustration surface 10 is moved relative to sensor 14, there may be other applications of the present invention wherein it may be feasible to move the sensors relative to the surface.

The apparatus further comprises circuit means (not shown) connected to the sensor 14 for detecting current signals induced in the electrodes in response to variations in the surface charge crossing the edge of the sensing electrode 14. The circuit means can be identical to that shown and described in the abovementioned U.S. Pat. No. 5,101,159. There is provided an identical circuit means for each sensor 14. The apparatus also comprises scanning means (not shown) operatively connected to the circuit means for scanning the detected current signals. A form of scanning means is shown in the referenced U.S. Pat. No. 5,101,159. There is also provided means (not shown) operatively connected to the scanning means for measuring at least one electrical parameter of the scanned signals to provide information on the charge density of surface 10 to determine the physical uniformity of the surface. A form of measuring means is shown and described in the referenced U.S. Pat. No. 5,101,159.

In accordance with the present invention, there is provided means generally designated 70 for maintaining a substantially zero voltage difference between sensor 14 and surface 10. In particular, electrical charge is applied to surface layer 10p to produce a first voltage or charge on layer 10p in reference to surface layer 10s. A second voltage or charge is applied to layer 10s so that upon relative movement between layer 10p and the edge of sensor 14 in a direction generally perpendicular or normal to layer 10p, no signal will be produced on the edge of sensor 14 in response to the voltage or charge on surface layer 10p. As a result, the requirements of selecting the area of sensor 14 to be sufficiently small and holding the spacing between sensor 14 and surface 10 constant to reduce noise are eliminated, while the advantages of obtaining increased signal strength and increased measurement resolution are obtained.

In particular, a substrate layer voltage/charge supply 72 provides the voltage Vs on line 74 which is applied to the substrate layer 10s by a slip ring arrangement generally designated 76 on the drum holding fixture in the apparatus shown in FIG. 1. Control of the voltage applied to substrate layer 10s is by means of a switch 80. In the rest position of switch 80 shown in FIG. 1 the voltage applied to line 74 is zero volts, and in the actuated position of switch 80 the voltage applied to line 74 is Vs = −Vp volts.

Figure 3A:
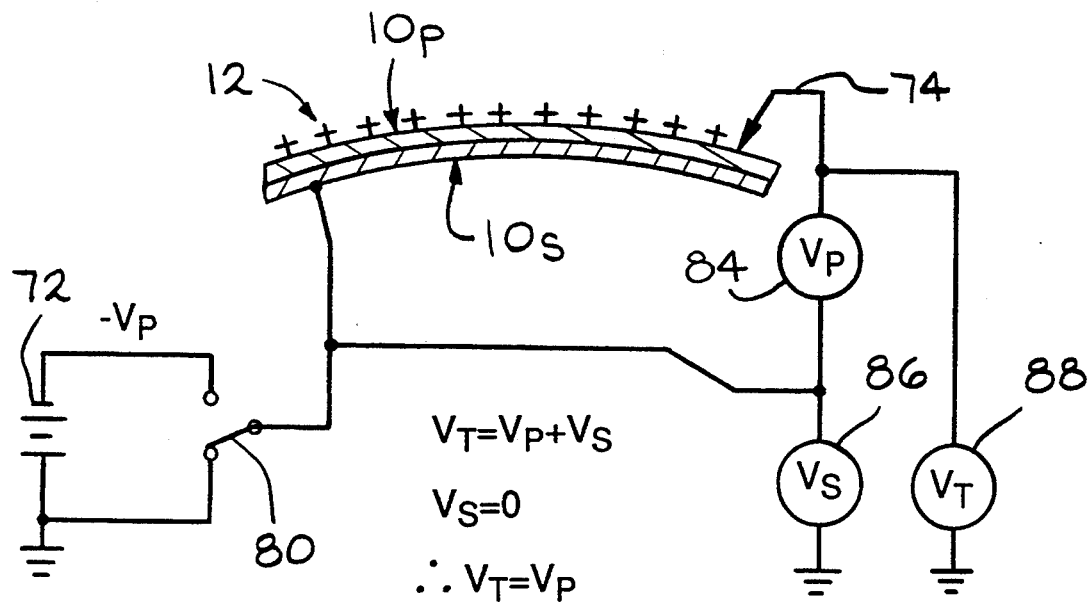
FIGS. 3A and 3B are diagrammatic views illustrating the operation of the method and apparatus of FIG. 1.
Figure 3B:
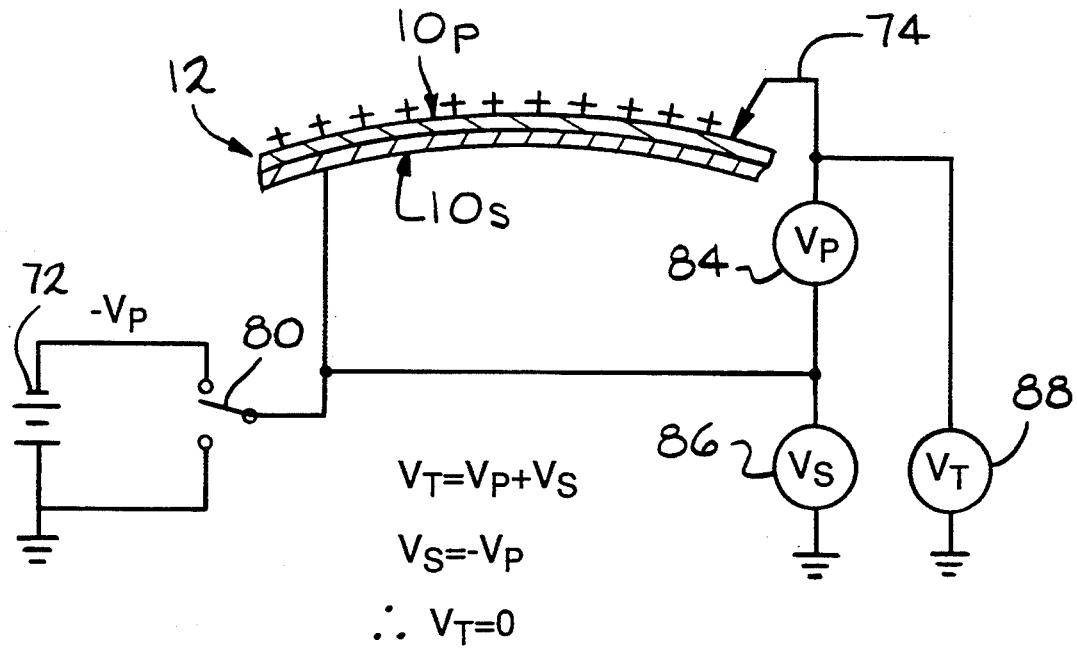

FIGS. 3A and 3B show fragmentary enlarged portions of surface 10 of drum 12 and illustrate the summation of voltages which cause the value of Vp, the photoconductive layer 10p voltage, to be summed to zero in reference to ground reference potential (zero volts). FIG. 3A illustrates the condition before switch 80 is actuated to apply Vs, the substrate layer 10s voltage, while FIG. 3B illustrates the condition after switch 80 is actuated. In FIG. 3A it can be seen that the charges on the surface of the photoconductor layer 10p produce a layer (10p) surface potential of, for example, 700 volts in reference to the conductive substrate layer 10s as shown by the voltage indicator/meter 84 (Vp) as conventionally known. The voltage indicator/meter 86 (Vs) shows the voltage level of the substrate layer 10s in reference to ground reference potential. Indicator/meter 88 (Vt) indicates, in reference to ground, the sum of Vp+Vs. In the Case of FIG. 3A, with switch 80 connecting the substrate layer 10s to ground, the voltage value of Vt =Vp+Vs is equal to Vp due to Vs =0 volts. In the case of FIG. 3B, with switch 80 actuated to apply to substrate layer 10s a voltage of Vs = −Vp, the voltage level of the surface of layer 10p in reference to ground reference, as shown by indicator/meter 88 (Vt), will be equal to zero volts.

During use, the method of operation of this apparatus is as follows. The photoconductive layer surface 10p is charged by component 40 to a testing voltage level of Vp of between 500 to 1000 volts during the time switch 80 is in the rest position to apply zero volts to the substrate layer 10s, i.e. substrate grounded. Actual test voltage levels and polarity may vary depending upon the particular drum type being tested. This may be designated the photoconductor surface charging cycle. Switch 80 is then actuated to apply a voltage level Vs to the drum substrate layer 10s prior to or while moving the sensor 14 toward the drum surface for drum testing. The value of voltage level Vs selected is a value which is equal in magnitude, but opposite in polarity, to the photoconductor surface 10p testing voltage level vp.

The charged voltage level Vp of the photoconductor surface of layer 10p is always in reference to the substrate layer 10s voltage level Vs. During the photoconductor surface 10p charging cycle, as described above, switch 80 applies a zero voltage level Vs to the substrate layer 10s. The photoconductor surface voltage level of Vp will thus be referenced to ground or zero potential level. When switch 80 is actuated, thus applying a voltage level Vs to substrate layer 10s which is equal to but opposite in polarity to the photoconductor layer surface 10p, the Vp voltage level, in reference to the substrate layer 10s, will remain at the Vp testing level but, in reference to ground, will shift to zero volts. When the sensor is now moved into position to measure the variation of charge on photoconductor layer surface 10p, there will exist a zero or very low potential difference between the sensor and layer surface 10p, because the sensor is also referenced to zero volts, i.e. ground.

If a charge non-uniformity is present on the surface, its detection will be made as described in the above-referenced U.S. Pat. No. 5,101,159. With a zero or low voltage difference between the sensor 14 and photoconductor layer surface 10p, no or very small noise currents will be induced into the sensor in response to distance charges occurring in the plane which is generally perpendicular to the plane of layer 10p, i.e. motion between sensor 14 and drum 12. These noise currents equal to i. are proportional to (Vp+Vs) times dc/dt, i.e. $i_n$ =(Vp+Vs) dc/dt where dc/dt is the change in capacitance between the sensor 14 and layer surface 10p, relative to time, caused by a variation in the distance between the sensor and layer surface 10p which occurs in the plane which is generally perpendicular to the plane of layer 10p. If the sum of Vp and Vs is equal to zero, then $i_n$, the noise current, will be equal to zero for any value of dc/dt caused by variation in the distance between sensor 14 and drum 12. However, if any variation in charge exists on photoconductor layer surface 10p, a current Is will be induced into the sensor 14 due to the term $i_s$=dv/dx times dx/dt, due to the movement of charge in a plane which is generally parallel to the plane of layer 10p, as described in the above-referenced U.S. Pat. No. 5,101,159.

The foregoing is illustrated further by the following example. In the case of photoconductor testing for defects or in the case of reading the photoconductor surface for image data the defects or data are manifested as areas on the photoconductor surface which have a different voltage or charge level relative to the surrounding area voltage or charge level. For example, if the photoconductor surface is charged to a general voltage level of say −700 volts an area may be found which is charged to a voltage level of −680 volts or −720 volts, in either case a 20 volt defect area may be described. Referring again to the apparatus shown in FIGS. 1 and 2, assume that a defect area on the surface of drum 12 is approaching the sensor 14 from the left as viewed in FIGS. 1 at 2 due to clockwise rotation of drum 12 past sensor 14. As the defect area crosses the edge of the sensor 14 a current $I_D$ is induced into the sensor surface. The magnitude of $I_D$ (defect current) is proportional to the voltage or charge level of the defect area in relation to the voltage or charge level of the surrounding areas of the photoconductor, the size of the defect area, the capacitance between the defect area and sensor 14, and the velocity of the drum 12.

In this way, by use of a plurality of sensors 14, the entire surface area of the drum 12 is scanned for defects. It should be noted that the defects lie in a plane which, in general, is moving in a direction which is parallel or tangential relative to the plane of the sensor. It also should be noted that the charge or voltage level of the defect area is −20 volts relative to the general charge or voltage level of the D.C. surface.

Unfortunately, besides the current $I_D$, which is proportional to the defect information, another current $I_N$ is also induced into the sensor 14. The current $I_N$ (noise current) is proportional to the voltage between the sensor surface and the photoconductor surface 10p times the rate change of capacitance there between:

$$I_N \propto [V_{Photoconductor\ Surface}] dc/dt$$

As the capacitance between the sensor surface and surface of the photoconductor is a function of the distance between sensor 14 and photoconductor surface 10p, any distance changes due to mechanical noise and vibration of the machine will produce a dc/dt term and will result in an $I_N$ if any voltage exists on the photoconductor surface relative to the normally rounded (zero voltage level) of the sensor 14.

The technique of the present invention reduces the voltage difference between sensor surface and photoconductor surface 10p to zero while maintaining the voltage difference between the photoconductor surface and the drum substrate so as not to disturb the electrophographic process.

Figure 2:
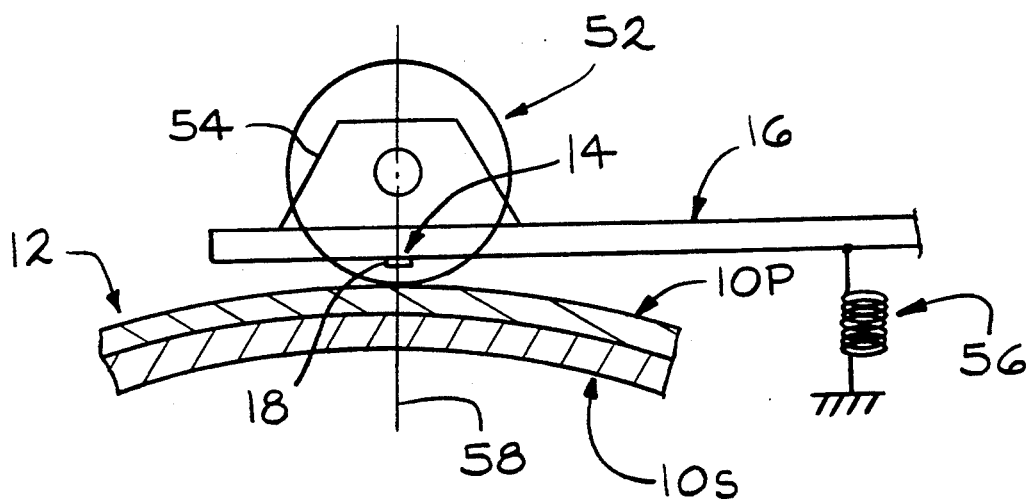
FIG. 2 is an enlarged schematic diagram of a portion of the apparatus shown in FIG. 2.

In the arrangement illustrated in FIGS. 1 and 2, the substrate 10s is connected to a volt supply, i.e. in this example to a +700 volt supply, to produce a voltage between the photoconductor surface and sensor surface equal to zero volts while maintaining a voltage difference between photoconductor surface 10p and the substrate 10s of −700V as before. With the system of the present invention, a capacitance chance (dc/dt) between photoconductor surface and sensor surface will not result in a $I_N$ current into the sensor 14. It should be noted that the capacitance change (dc/dt) is due to mechanical motion which varies the distance between sensor surface and photoconductor surface 10p and therefore is motion which occurs in a plane which is, in general, perpendicular or normal to the plane of the sensor 14. This is also true for any motion which has components of motion which can be translated as motion into the perpendicular or normal plane. Any motion due to mechanical noise or vibration which occurs in a plane which is parallel or tangential to the plane of the sensor surface will not contribute to $I_N$ because these motions do not produce a dc/dt term between the sensor surface and photoconductor surface 10p.

The detection of the defected areas along the surface of the photoconductor is not in any way affected by the substrate biasing technique. As previously explained, the magnitude of the current $I_D$ (defect induced current) is proportional to the voltage or charge level of the defected area in relation to the voltage or charge level of the surrounding areas (as one of the factors).

The voltage level of the defect area is −680 volts while the general voltage level of the photoconductor surface 10p is −700V, both in reference to ground. The voltage therefore is +20 volts. After application of the substrate bias voltage the voltage level of the defect area will be +20 volts while the voltage level of the photoconductor surface will be zero volts, both in reference to ground. However, the voltage difference of +20 volts experienced prior to application of the substrate bias level will be maintained after application of the substrate bias level, thus the detection of the defected area by the sensor 14 will be undisturbed by application of the substrate bias level. The net result of the technique of the present invention is a highly significant increase in the signal to noise ratio of the measurement, as well as the other advantages described herein.

The advantages of the method and apparatus of the present invention are many. For example, with zero or low voltage between the sensor 14 and photoconductor layer surface 10p, during the drum measurement process, no voltage arc-over may occur at even very close spacings. In addition, with the method and apparatus of the present invention, it is no longer necessary to reduce the capacitance between the sensor 14 and drum 12, by making the area of the sensor 14 sufficiently small, in order to reduce the generation of noise. Similarly, it is no longer necessary to reduce the change in the capacitance, relative to time, between the sensor and drum by eliminating variation in the distance between sensor 14 and drum 12 in order to reduce the generation of noise. By eliminating the voltage stress between sensor 14 and photoconductor layer surface 10p, by providing a zero voltage difference there-between according to the present invention, no noise signals generated by Vt dc/dt can exist. Vt is the differential voltage between sensor 14 and photoconductor surface 10p, and dc/dt is the change in capacitance between sensor 14 and photoconductor surface 10p caused by the change in distance there-between.

In addition, because the sensor 14 may now be moved to very close in proximity to the photoconductor layer surface 10p without fear of arc-over, the sensitivity of the measurement to very small charge non-uniformities is dramatically increased while the spatial resolution capability is also dramatically increased, as is readily understood by those skilled in the art. Furthermore, if, due to machine wear, variations in the sensor to photoconductor layer surface 10p occur due to increased mechanical noise and vibrations, $i_n$, the noise current, will not increase, as in methods and apparatus heretofore available. Accordingly, the embodiment illustrated in FIGS. 1-3 therefore accomplishes the objectives of the present invention.

Figure 4:
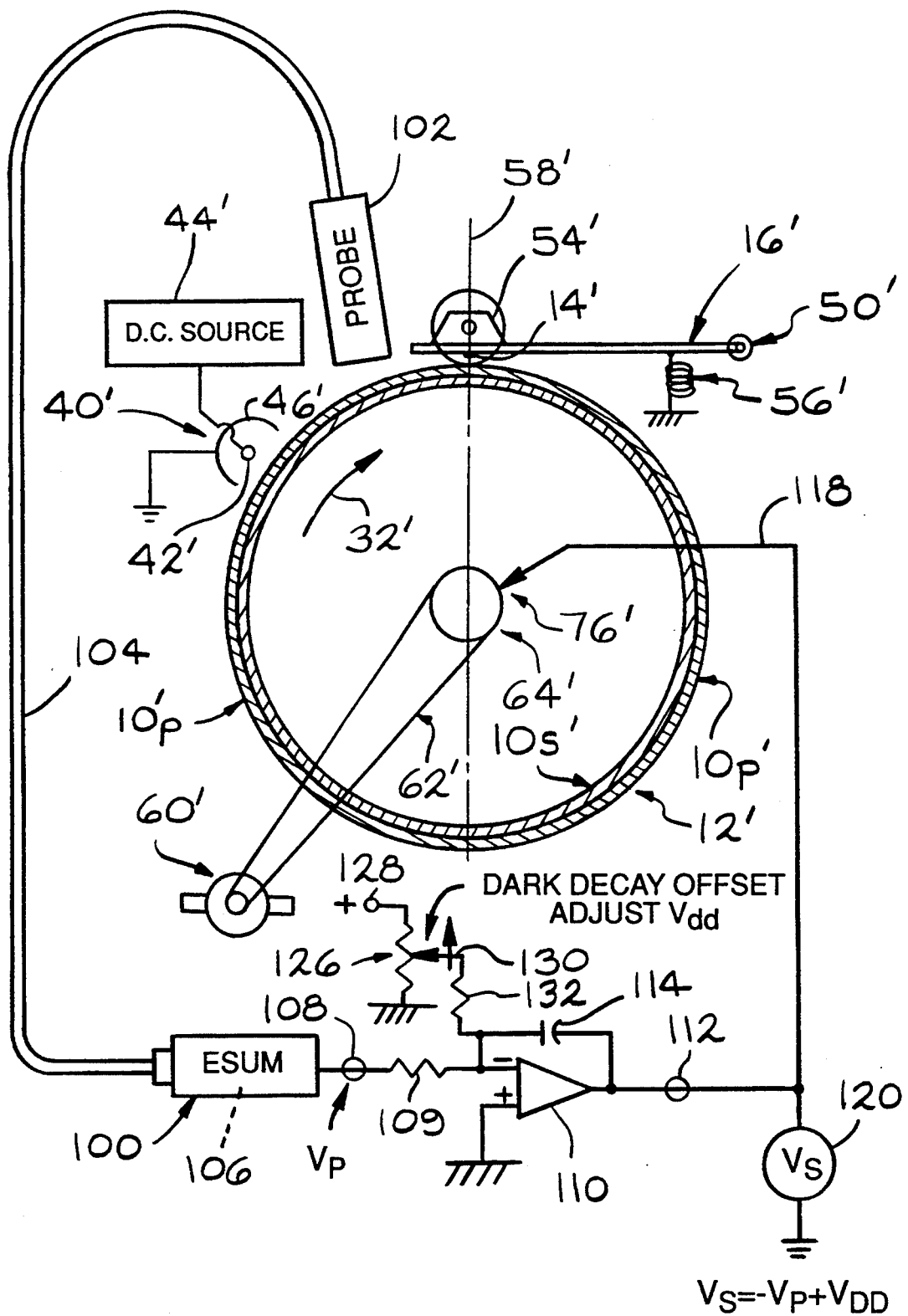
FIG. 4 is a schematic diagram illustrating the method and apparatus according to another embodiment of the present invention.

FIG. 4 illustrates apparatus according to another embodiment of the present invention for determining the charge or voltage distribution of an electrophotographic surface. In FIG. 4 components of the apparatus identical to those of the embodiment of FIGS. 1-3 are identified by the same reference numerals provided with a prime designation. In the embodiment of FIG. 4, the switch S1 of the embodiment of FIGS. 1-3 is eliminated, and Vs, the substrate layer voltage, is supplied by an automatic control system in the following manner. The photoconductor layer surface 10p' voltage Vp' is monitored using a conventional noncontacting electrostatic voltmeter 100 in an area located in proximity to and just before the sensor area in respect to the rotation of the drum. The output of the electrostatic voltmeter 100 is integrated to produce the Vs' substrate layer 10s' voltage.

In particular, electrostatic voltmeter 100 includes a probe 102 positioned in spaced, operative relationship to photoconductor layer surface 10p' between charging means 40' and sensor electrode 14'. Probe 102 is connected electrically via a cable 104 to the voltmeter operating circuit 106 having an output designated 108. Electrostatic voltmeter 100 is of the type commercially available from Trek, Inc., Medina, N.Y. The output of voltmeter 100 is connected through a resistor 109 to the inverting input terminal of a high voltage integrating amplifier 110 having an output 112 and a feedback capacitor 114 connected between output 112 and the inverting input terminal. The output 112 of amplifier 110 is connected by line 118 to the drum slip ring arrangement 76', and the voltage output of amplifier 110 is monitored by a meter 120 connected between output 112 and ground. The non-inverting input of amplifier 100 is connected to ground.

Thus, the value of Vs' voltage automatically produced is the value needed to drive the voltage level Of the photoconductor layer surface 10p' to a zero voltage level in respect to ground as monitored by the electrostatic voltmeter 100. This produces, automatically, a feedback control to automatically cause a level of Vs' to be produced which is exactly equal, and opposite in polarity, to the level of voltage existing between photoconductor layer surface 10p' and substrate layer 10s', thus driving the voltage between the sensor and photoconductor layer surface 10p' to zero.

When testing electrophotographic drums using the method and apparatus of the present invention, there could be a difference in the voltage Vp', as monitored by the voltmeter 100, and the Vp' voltage level on the portion of layer surface 10p' which is entering the region of sensor electrode 14', due to the time difference between the area of measurement of Vp by the voltmeter 100 and the area of measurement by the sensor electrode 14'. This voltage difference is dependent upon the surface speed of drum 12' and the charge decay on the photoconductor layer surface 10p' due to the dark decay characteristic of the photoconductor, as conventionally known. This voltage difference can be easily accommodated by the automatic control system of the present invention. This is accomplished by the use of a second signal input to the control system, to offset the value of Vs produced, so as to cause the value of Vp, as referenced to ground, to be zero as it crosses through the sensor area.

In particular, suppose upon system turn-on, for example, the voltage of photoconductor layer surface 10p' in reference to ground, is charged to 700 volts. In response to the detection of a 700 volts level by the electrostatic voltmeter 100, the automatic control system will produce a voltage level on substrate layer 10s' equal to negative 700 volts to cause the ESVM to now measure a photoconductor layer surface 10p' voltage level Vp' of zero volts. If, due to the dark decay characteristic, the voltage Vp' in reference to the substrate layer 10s' decays, for example, by 20 volts (to a value of 680 volts) at the area of sensor 14' in reference to the substrate layer 10s', the decayed voltage level on the photoconductor layer surface 10p', as it enters the sensor measuring area, would produce a −20 volt level difference between photoconductor layer surface 10p' and the sensor.

This offset effect due to the dark decay can be completely eliminated by introducing a small offset signal into the Vs' automatic control system to cause Vs' to be driven to −680 volts rather than −700 volts. This will cause the voltage level difference between the sensor and photoconductor layer surface 10p' in the area of sensor measurement to be established again at zero volts. This small offset is accomplished by the dark decay offset adjustment designated $V_{dd}$ in FIG. 4. In particular, there is provided an offset signal supplying circuit including a potentiometer 126 connected between a source 128 of positive direct voltage and electrical ground. The wiper arm 130 of potentiometer 126 is connected through a resistor 132 to the inverting input of amplifier 110. The voltage on the potentiometer wiper arm 130 is the dark decay offset adjustment voltage $V_{dd}$.

Figure 5:
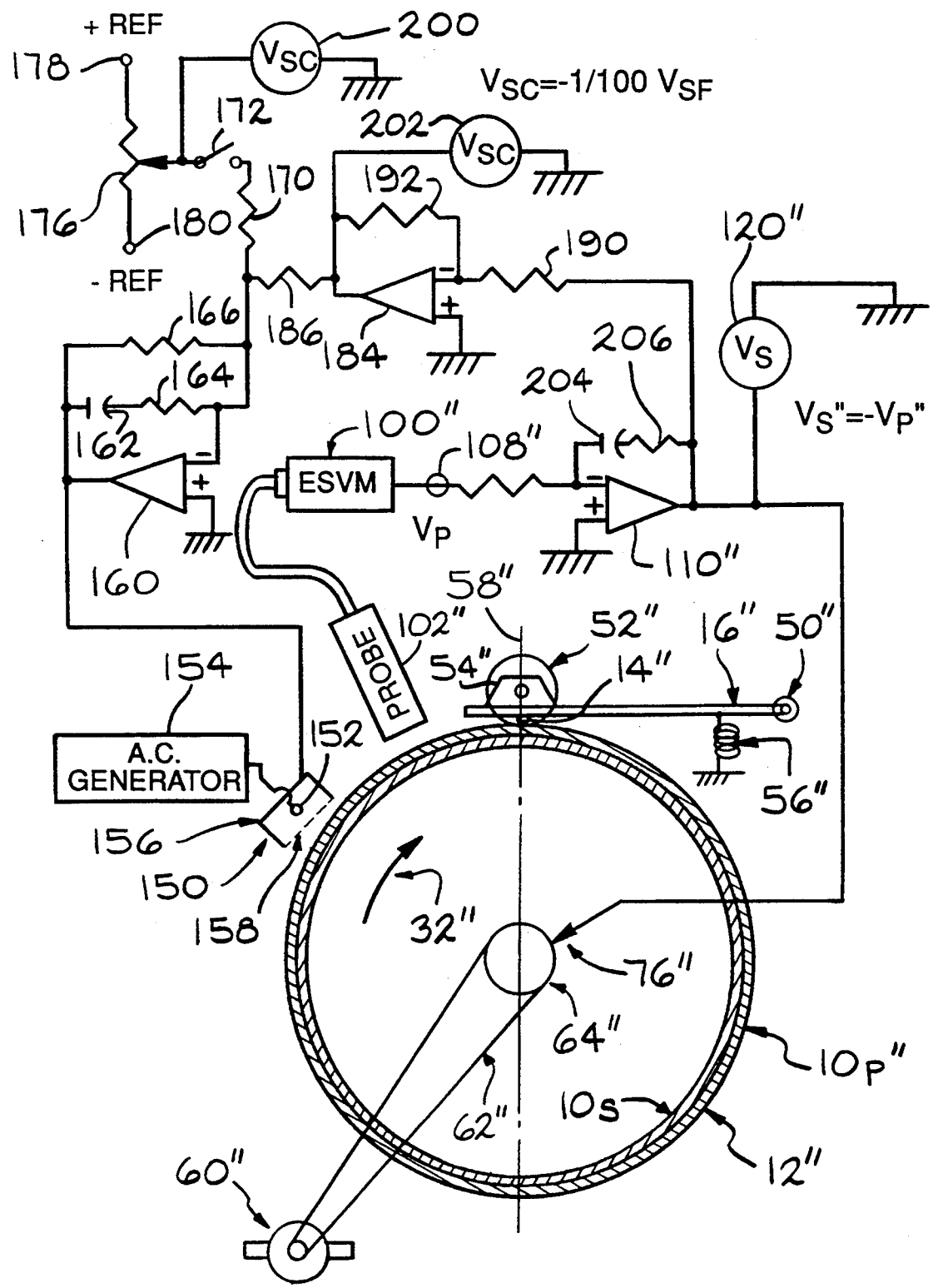
FIG. 5 is a schematic diagram illustrating the method and apparatus according to another embodiment of the present invention.

FIG. 5 illustrates apparatus according to another embodiment of the present invention wherein control is integrated with charging of the surface so that the substrate voltage feedback control system is in operation at all times. In FIG. 5 components of the apparatus identical to those of the apparatus of FIG. 4 are identified by the same reference numeral with a double prime designation. In particular, the automatic control system is integrated with the operation of a charging system 150, which could be a scorotron or other ion producing element, as conventional known, to allow the Vs" feedback control system to be in operation at all times, even during the drum charging cycle. Operation of the Vs" feedback control system integrated with the charging system 40" has the advantage of more closely regulating the photoconductor layer 10p " charge level Vp" over that obtainable by using the charging system independently, as in prior art methods and apparatus.

As shown in FIG. 5, the Vs" automatic control system, comprising the electrostatic voltmeter 100" and 102" probe together with amplifier 110", supplies a value of Vs", the substrate layer 10s" voltage, which will automatically cause the value of Vp", the photoconductor layer 10p " surface voltage, as read by the probe 102", to be driven to zero volts as previously shown. This will establish Vp", between the photoconductor layer 10p " and substrate layer 10s", at the desired drum testing level. Also shown is a charging system 150 having an ion generating wire 152 connected to a high voltage A.C. generator 154. The use of a high voltage A.C. generator for the supply 150 will provide a source of either polarity (+ or −) air ion as conventionally known. The charging system shield 156 and grid 158 are connected together, as conventionally known, and are connected to the output of high voltage amplifier 160. The dynamic components comprising capacitor 162 and resistors 164 and 166 across amplifier 160 are used to set the time response, gain and damping characteristics of this charging system control loop. Applied to the input of amplifier 160 through resistor 170 and switch 172 is a signal proportional to the desired value of drum testing voltage between photoconductor layer surface 10p " and substrate layer 10s". This desired voltage level command Vsc is derived from potentiometer 176 which is used to select the desired level and polarity of Vsc from plus and minus reference supplies 178 and 180, respectively. Also summed into the input of amplifier 160 is the output of an inverting amplifier 184 applied through resistor 186. This allows the use of low values of reference voltage, for example plus 10 volts and minus 10 volts, which correspond to photoconductor charge levels of minus 1000 volts and plus 1000 volts respectively. Resistors 190 and 192 are selected at a ratio of approximately 100 to 1 to cause amplifier 184 to have a gain of approximately −1/100. Other ratios could be used. The ratio of resistor 186 to resistor 170 is approximately 1 to 1.

The operation of the system of FIG. 5 is as follows. The desired value of drum testing voltage and polarity, as read on Vsc indicator 200, is obtained by adjusting potentiometer 176. It should be noted that to obtain negative polarity substrate layer voltage values, negative polarity values of Vsc are selected. Positive polarity values of Vsc are selected to cause positive polarity values of Vs" while the magnitude of Vs" will be 100 times the magnitude of Vsc.

Upon activation of switch 172, Vsc, through resistor 170, will cause a current flow into amplifier 160 which will produce at the shield 156 and grid 158 of charging system 150 a bias level to cause air ions to leave the charging system 150 and flow to the surface of photoconductor layer 10p ". Upon detection of any photoconductor surface 10p " voltage Vp", the probe 102" of electrostatic voltmeter 100" will cause the generation of substrate layer 10s" voltage Vs" to appear at the output of integrating high voltage amplifier 110'", as previously explained. In this embodiment, amplifier 110'" has a feedback circuit comprising capacitor 204 and resistor 206 connected Erom the output to the inverting input thereof.

Air ions will continue to flow to cause ever increasing values of Vs" until the output of amplifier 184, as shown by Vsc indicator 202, reaches a value of voltage equal to −Vsc at which time the current into amplifier 160, as established by the voltage of potentiometer 176 and resistor 170 is matched by an equal and opposite current as established by the output voltage of amplifier 184 and resistor 186. At this time the bias level, as applied to shield 156 and grid 158 of charging system 150 returns to zero bias to stop any further air ions from leaving the charging system 150.

If for any reason the value of Vs" were to overshoot, thereby producing a value of Vsc at the output of amplifier 184 in excess of the desired value, the output of amplifier 160 would drive the bias level to the charging system 150 to the opposite direction to cause the opposite polarity of air ion to leave the charging system 150 to discharge the photoconductor surface to the proper level. The ability of the charging system 150 to supply either polarity of air ion to either charge or discharge the photoconductor surface is conventionally known. As conventionally used, the charging system grid 158 is normally biased at a fixed voltage level equal to the desired photoconductor test voltage. In the conventional system, the photoconductor layer 10p " surface voltage Vp" would be allowed to rise in response to the air ions impinging on layer 10p " to a level close to, but never quite equal to, the bias level of charging system grid 158. However, the method and apparatus of the present invention will not allow this conventional process to occur because the Vs" control loop will not allow a photoconductor surface 10p " voltage Vp" to appear, relative to ground, (or relative to grid 158).

Figure 6:
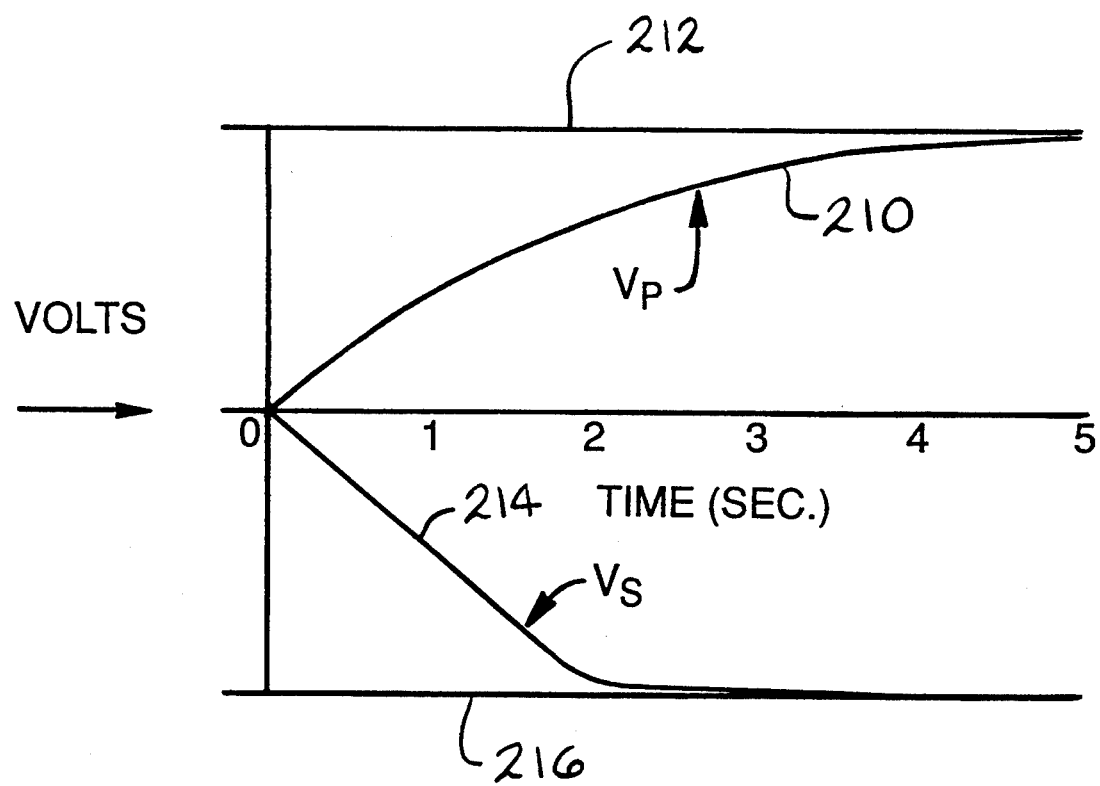
FIG. 6 is graph illustrating the operation of the method and apparatus of the present invention.

The advantage of the charging system control loop as used in conjunction with the (Vs) control loop is shown in FIG. 6 which shows a typical photoconductor rise in voltage with time using the conventional charging system method. Also shown is the response of −Vs"=Vp" using the method of this invention. As shown, using the conventional methods the rate of rise of the photoconductor surface voltage Vp tends to follow a exponential response curve 210 due to the decrease in electric field strength between charging system grid 158 and photoconductor surface 10p " due to the rise in voltage on the photoconductor surface. This decreasing electric field causes a decrease in air ion mobility from the charging system 150. As conventionally known, an error between the desired photoconductor level and bias level of the charging system 150 will exist for a long period of time as dictated by the typical exponential response. Voltage level 212 is the desired value of photoconductor surface voltage using the conventional method.

As also shown on the same graph, the value of Vs", where Vs"=−Vp", is shown to have a time response 214 approximately three times faster than the conventional method. This occurs because, with the employment of the Vs" control system, the photoconductor layer 10p " surface voltage Vp" is not allowed to rise relative to ground so that no decrease in electric field strength occurs between surface 10p " and charging system grid 158 during the charging process. This results in the charging current to the drum being constant rather than following an exponential charging curve. Voltage level 216 is the desired value of photoconductor layer voltage between 10p and 10s=Vs using the method and apparatus of the present invention. The specific advantage, which this new photoconductor surface charging system provides, is with the fast and accurate surface charging obtainable with this technique.

The method and apparatus of the present invention advantageously can be applied to electrophotographic imaging. In the use of general electrophotographic imaging processes, which employ the charging method of the present invention whereby during the photoconductor charging cycle, the photoconductor layer surface voltage relative to ground is kept at zero by applying a bias level to the substrate layer, will open up new and improved performance of electrophotographic processes. For example, it is known that the use of electrophotography surface imaging together with x-ray technology produces a biologically safer technique than the use of conventional photographic film as the image forming media. However a disadvantage inherent in the use of these electrophotographic imaging surface techniques is that the image produced is the negative of the actual image formed. This is also true when using photographic film in these processes. Using the method of the present invention whereby the substrate layer is biased to charge the level of the photoconductor surface relative to ground, a positive image rather than a negative image is produced which makes interpretation of the image by medical personnel easier. In addition, if the electrophotographic image is read directly, prior to the development process, by the use of the method and apparatus of this invention, a high resolution, low noise image could be reproduced.

It should be noted that, although it is desirable when using the method and apparatus of this invention to apply a substrate layer bias voltage level equal to the photoconductor layer voltage level Vp, particularly in those applications where the method and technique is used for photoconductor quality inspection, it may be desirable to use different values of Vs not equal to Vp. For example, in electrophotographic processes, which employ the development phase by the use of toner or other development substances, the voltage applied to the substrate layer may be adjusted to improve the quality of the developed image in such areas as contrast or developed image resolution. In some cases it may be desirable to apply an A.C. bias voltage to the substrate either with or without a D.C. bias level to improve the performance and quality of the development process to compensate for deficiencies in the physical or chemical properties of the development substances such as toner.

It is therefore apparent that the present invention accomplishes its intended objects. While embodiments of the present invention have been described in detail, that is for the purpose of illustration, not limitation.

What is claimed is:

1. A high spatial resolution, low noise method for determining electrical characteristics such as the voltage density distribution or the charge density distribution of an electrophotographic medium having a surface and capable of holding electrical charge, said method comprising the steps of:
   a) applying electrical charge to said surface;
   b) providing at least one sensor in close proximity to said surface and having an edge;
   c) disposing said sensor in relation to said surface so that upon relative movement between said surface and said sensor edge in a direction generally tangent or parallel to said surface said sensor will produce a signal in response to variations in said voltage or charge along said surface;
   d) causing relative movement between said surface and said sensor edge in a direction generally tangent or parallel to said surface;
   e) maintaining a substantially zero voltage difference between said sensor and said surface;
   f) detecting a signal induced on said sensor edge in response to a variation in said voltage or said charge on said surface as it crosses said sensor edge; and
   g) measuring an electrical parameter of said signal to provide information on said variation of said voltage or said charge on said surface to determine the voltage density distribution or the charge density distribution on said surface.

2. The method according to claim 1, wherein said step of maintaining a substantially zero voltage difference between said sensor and said surface comprises:
   a) applying a first voltage or charge to one portion of said electrophotographic medium; and
   b) applying a second voltage or charge to another portion of said electrophotographic medium so that upon relative movement between said surface and said edge of said sensor in a direction generally perpendicular or normal to said surface no signal will be produced on said edge of said sensor in response to the voltage or charge on said first portion of said electrophotographic medium.

3. The method according to claim 2, wherein said second voltage or charge is equal to and opposite in polarity to said first voltage or charge.

4. The method according to claim 2, wherein said step of applying said second voltage or charge to said another portion of said electrophotographic medium is performed by sensing the voltage or charge on said one portion of said electrophotographic medium prior to said one portion passing said edge of said sensor and providing said second voltage or charge as determined by the nature of the sensed voltage or charge.

5. The method according to claim 4, wherein said second voltage or charge is equal to and opposite in polarity to said first voltage or charge.

6. The method of claim 4 further including providing an offset signal to vary the magnitude of said second voltage or charge to compensate for any change in the voltage or charge on said portion of said electrophotographic medium during the time between the sensing of the voltage or charge and the passing said edge of said sensor.

7. The method according to claim 6, wherein said offset signal depends upon the speed of relative movement between said surface and said edge of said sensor and the decay of charge or voltage on said one portion of said electrophotographic medium due to the dark decay characteristic of said one portion of said medium.

8. The method according to claim 4 further including controlling the applying electrical charge to said surface in coordination with the providing said second voltage or charge as determined by the nature of the sensed voltage or charge.

9. The method according to claim 4 further including:
   a) providing a first control signal representing a selected value of charge for application to said surface;
   b) providing a second control signal derived from said second voltage or charge as determined by the nature of the sensed voltage; and
   c) utilizing said first and second control signals to control said step of applying electrical charge to said surface.

10. The method according to claim 2, wherein said step of applying said second voltage or charge to said another portion of said electrophotographic medium is performed by sensing by means of an electrostatic voltmeter the voltage or charge on said one portion of said electrophotographic medium prior to said one portion passing said edge of said sensor and utilizing the output of said electrostatic voltmeter to provide a feedback control to provide said second voltage or charge as determined by the nature of the sensed voltage or charge.

11. The method according to claim 10, wherein said second voltage or charge is equal to and opposite in polarity to said first voltage or charge.

12. The method according to claim 10 further including providing an offset signal to vary said feedback control to compensate for any change in the voltage or charge on said one portion of said electrophotographic medium during the time between the sensing of the voltage or charge by said electrostatic voltmeter and the passing said edge of said sensor.

13. The method according to claim 12, wherein said offset signal depends upon the speed of relative movement between said surface and said edge of said sensor and the decay of charge or voltage on said one portion of said electrophotographic medium due to the dark decay characteristic of said one portion of said medium.

14. A high spatial resolution, low noise method for determining electrical characteristics such as the voltage density distribution or the charge density distribution of an electrophotographic medium comprising at least an electrical charge retaining first layer and an electrically conductive second layer, said method comprising the steps of:

a) applying electrical charge to said first layer to produce a first voltage or charge on said first layer in reference to said second layer;

b) providing at least one sensor in close proximity to said first layer and having an edge;

c) disposing said sensor in relation to said first layer so that upon relative movement between said first layer and said edge of said sensor in a direction generally tangent or parallel to said first layer, said sensor will produce a signal in response to variations in said first voltage or charge along said first layer;

d) applying to said second layer a second voltage or charge so that upon relative movement between said first layer and said edge of said sensor in a direction generally perpendicular or normal to said first layer, no signal will be produced on said sensor edge in response to said first voltage or charge on said first layer;

e) causing relative movement between said first layer and said edge of said sensor in a direction generally tangent or parallel to said first layer;

f) detecting a signal induced on said edge of said sensor in response to a variation in said first voltage or g) charge on said first layer as it crosses said edge of said sensor; and measuring an electrical parameter of said signal to provide information on the variation of said first voltage or charge on said first layer to determine the voltage or charge density distribution on said first layer.

15. The method according to claim 14, wherein said second voltage or charge is equal to and opposite in polarity to said first voltage or charge.

16. The method according to claim 14, wherein said step of applying said second voltage or charge to said second layer is performed by sensing the voltage or charge on said first layer prior to said first layer passing said edge of said sensor and providing said second voltage or charge as determined by the nature of the sensed voltage or charge.

17. The method according to claim 16, wherein said second voltage or charge is equal to and opposite in polarity to said first voltage or charge.

18. The method according to claim 16 further including providing an offset signal to vary the magnitude of said second voltage or charge to compensate for any change in the voltage or charge on said first layer during the time between the sensing of the voltage or charge and the passing said edge of said sensor.

19. The method according to claim 18, wherein said offset signal depends upon the speed of relative movement between said first layer and said edge of said sensor and the decay of charge or voltage on said first layer due to the dark decay characteristics of said first layer.

20. The method according to claim 16 further including controlling the applying electrical charge to said first layer in coordination with the providing said second voltage or charge as determined by the nature of the sensed voltage or charge.

21. The method according to claim 20 further including:

a) providing a first control signal representing a selected value of charge for application to said first layer;

b) providing a second control signal desired from said second voltage or charge as determined by the nature of the sensed voltage; and c) utilizing said first and second control signals to control said step of applying electrical charge to said first layer.

22. The method according to claim 14, wherein said step of applying said second voltage or charge to said second layer is performed by sensing by means of an electrostatic voltmeter the voltage or charge on said first layer prior to said first layer passing said edge of said sensor and utilizing the output of said electrostatic voltmeter to provide a feedback control to provide said second voltage or charge as determined by the nature of the second voltage or charge.

23. The method according to claim 22, wherein said second voltage or charge is equal to and opposite in polarity to said first voltage or charge.

24. The method according to claim 22 further including providing an offset signal to vary said feedback control to compensate for any change in the voltage or charge on said first layer during the time between the sensing of the voltage or charge by said electrostatic voltmeter and the passing said edge of said sensor.

25. The method according to claim 24, wherein said offset signal depends upon the speed of relative movement between said first layer and said edge of said sensor and the decay of charge or voltage on said first layer due to the dark decay characteristics of said first layer.

26. A high spatial resolution, low noise apparatus for determining electrical characteristics such as the voltage density distribution or the charge density distribution of an electrophotographic medium having a surface and capable of holding electrical charge, said apparatus comprising:

a) means for applying electrical charge to said surface;

b) at least one sensor in close proximity to said surface and having an edge;

c) means for disposing said sensor in relation to said surface so that upon relative movement between said surface and said sensor edge in a direction generally tangent or parallel to said surface said sensor will produce a signal in response to variations in said voltage or charge along said surface;

d) means for causing relative movement between said surface and said sensor edge in a direction generally tangent or parallel to said surface;

e) means for maintaining a substantially zero voltage difference between said sensor and said surface;

f) means for detecting a signal induced on said sensor edge in response to a variation in said voltage or said charge on said surface as it crosses said sensor edge; and g) means for measuring an electrical parameter of said signal to provide information on said variation of said voltage or said charge on said surface to determine the voltage density distribution or the charge density distribution on said surface.

27. Apparatus according to claim 26, wherein said means for maintaining a substantially zero voltage difference between said sensor and said surface comprises:

a) means for applying a first voltage or charge to one portion of said electrophotographic medium; and b) means for applying a second voltage or charge to another portion of said electrophotographic medium so that upon relative movement between said surface and said edge of said sensor in a direction generally perpendicular or normal to said surface no signal will be produced on said edge of said sensor in response to the voltage or charge on said first portion of said electrophotographic medium.

28. Apparatus according to claim 27, wherein said means for applying said second voltage or charge includes means for providing a voltage or charge equal to and opposite in polarity to said first voltage or charge.

29. Apparatus according to claim 27, wherein said means for applying said second voltage or charge includes means for sensing the voltage or charge on said one portion of said electrophotographic medium prior to said one portion passing said edge of said sensor so that said second voltage or charge is provided as determined by the nature of the sensed voltage or charge.

30. Apparatus according to claim 29, wherein said means for applying said second voltage or charge includes means for applying a voltage or charge equal to and opposite in polarity to said first voltage or charge.

31. Apparatus according to claim 29 further including means for providing an offset signal to vary the magnitude of said second voltage or charge to compensate for any change in the voltage or charge on said one portion of said electrophotograhpic medium during the time between the sensing of the voltage or charge and the passing said edge of said sensor, said offset signal depending upon the speed of relative movement between said surface and said edge of said sensor and the decay of charge or voltage on said one portion of said electrophotographic medium due to the dark decay characteristic of said one portion of said medium.

32. Apparatus according to claim 29 further including means operatively connected to said means for applying electrical charge to said surface and operatively connected to said means for applying said second voltage or charge for controlling the applying electrical charge to said surface in coordination with the providing said second voltage or charge as determined by the nature of the sensed voltage or charge.

33. Apparatus according to claim 32, wherein said means for controlling the applying electrical charge to said surface comprises:
a) means for providing a first control signal representing a selected value of charge for application to said surface;
b) means for providing a second control signal derived from said second voltage or charge as determined by the nature of the sensed voltage; and
c) means for utilizing said first and second control signals to control said step of applying electrical charge to said surface.

34. Apparatus according to claim 27, wherein said means for applying said second voltage or charge comprises:
a) electrostatic voltmeter means for sensing the voltage or charge on said one portion of said electrophotographic medium prior to said one portion passing said edge of said sensor; and
b) feedback control means for utilizing the output of said electrostatic voltmeter to provide said second voltage or charge as determined by the nature of the sensed voltage or charge.

35. Apparatus according to claim 34, wherein said feedback control means includes means for providing said second voltage or charge equal to and opposite in polarity to said first voltage or charge.

36. Apparatus according to claim 34 further including means for providing an offset signal to vary the operation of said feedback control means to compensate for any change in the voltage or charge on said one portion of said electrophotographic medium during the time between the sensing of the voltage or charge by said electrostatic voltmeter means and the passing said edge of said sensor, said offset signal depending upon the speed of relative movement between said surface and said edge of said sensor and the decay of charge or voltage on said one portion of said electrophotographic medium due to the dark decay characteristic of said one portion of said medium.

37. A high spatial resolution, low noise apparatus for determining electrical characteristics such as the voltage density distribution or the charge density distribution of an electrophotographic medium comprising at least an electrical charge retaining first layer and an electrically conductive second layer, said apparatus comprising:
a) means for applying electrical charge to said first layer to produce a first voltage or charge on said first layer in reference to said second layer;
b) at least one sensor in close proximity to said first layer and having an edge;
c) means for disposing said sensor in relation to said first layer so that upon relative movement between said first layer and said edge of said sensor in a direction generally tangent or parallel to said first layer, said sensor will produce a signal in response to variations in said first voltage or charge along said first layer;
d) means for applying to said second layer a second voltage or charge so that upon relative movement between said first layer and said edge of said sensor in a direction generally perpendicular or normal to said first layer, no signal will be produced on said sensor edge in response to said first voltage or charge on said first layer;
e) means for causing relative movement between said first layer and said edge of said sensor in a direction generally tangent or parallel to said first layer;
f) means for detecting a signal induced on said edge of said sensor in response to a variation in said first voltage or charge on said first layer as it crosses said edge of said sensor; and
g) means for measuring an electrical parameter of said signal to provide information on the variation of said first voltage or charge on said first layer to determine the voltage or charge density distribution on said first layer.

38. Apparatus according to claim 37, wherein said means for applying said second voltage or charge includes means for providing a voltage or charge equal to and opposite in polarity to said first voltage or charge.

39. Apparatus according to claim 37, wherein said means for applying said second voltage or charge includes means for sensing the voltage or charge on said first layer prior to said first layer passing said edge of said sensor so that said second voltage or charge is provided as determined by the nature of the sensed voltage or charge.

40. Apparatus according to claim 39, wherein said means for applying said second voltage or charge includes means for providing a voltage or charge equal to and opposite in polarity to said first voltage or charge.

41. Apparatus according to claim 39 further including means for providing an offset signal to vary the magnitude of said second voltage or charge to compensate for any change in the voltage or charge on said first layer during the time between the sensing of the voltage or charge and the passing said edge of said sensor, said offset signal depending upon the speed of relative movement between said first layer and said edge of said sensor and the decay of charge or voltage on said first layer due to the dark decay characteristic of said first layer.

42. Apparatus according to claim 39 further including means operatively connected to said means for applying electrical charge to said first layer and operatively connected to said means for applying said second voltage or charge for controlling the applying electrical charge to said first layer in coordination with the providing said second voltage or charge as determined by the nature of the second voltage or charge.

43. Apparatus according to claim 42, wherein said means for controlling the applying electrical charge to said first layer comprises:
   a) means for providing a first control signal representing a selected value of charge for application to said first layer;
   b) means for providing a second control signal derived from said second voltage or charge as determined by the nature of the sensed voltage; and
   c) means for utilizing said first and second control signals to control said step of applying electrical charge to said first layer.

44. Apparatus according to claim 37, wherein said means for applying said second voltage or charge comprises:
   a) electrostatic voltmeter means for sensing the voltage or charge on said first layer prior to said first layer passing said edge of said sensor; and
   b) feedback control means for utilizing the output of said electrostatic voltmeter to provide said second voltage or charge as determined by the nature of the sensed voltage or charge.

45. Apparatus according to claim 44, wherein said feedback control means includes means for providing said second voltage or charge equal to and opposite in polarity to said first voltage or charge.

46. Apparatus according to claim 44 further including means for providing an offset signal to vary the operation of said feedback control means to compensate for any change in the voltage or charge on said first layer during the time between the sensing of the voltage or charge by said electrostatic voltmeter means and the passing said edge of said sensor, said offset signal depending upon the speed of relative movement between said first layer and said edge of said sensor and the decay of charge or voltage on said first layer due to the dark decay characteristic of said first layer.

47. A high spatial resolution, low noise method for charging an electrophotographic medium for use in imaging processes wherein said medium comprises at least an electrical charge retaining first layer and an electrically conductive second layer, said method comprising the steps of:
   a) applying electrical charge to said first layer to produce a first voltage or charge on said first layer in reference to said second layer; and
   b) applying to said second layer a second voltage or charge of a magnitude and polarity so that the voltage between said first layer in reference to electrical ground is maintained at zero.

48. A high spatial resolution method for charging an electrophotographic medium for use in electrophotographic processes which employ a development phase by the use of toner or the like and wherein said medium comprises at least an electrical charge retaining first layer and an electrically conductive second layer, said method comprising the steps of:
   a) applying electrical charge to said first layer to produce a first voltage or charge on said first layer in reference to said second layer; and
   b) applying to said second layer a second voltage or charge of a magnitude and polarity selected to provide a developed image having enhanced quality of contrast and resolution.

49. The method according to claim 48 wherein said second voltage has an a.c. component.

* * * * *

UNITED STATES PATENT AND TRADEMARK OFFICE
CERTIFICATE OF CORRECTION

PATENT NO. : 5,448,337
DATED : September 5, 1995
INVENTOR(S) : Bruce T. Williams It is certified that error appears in the above-indentified patent and that said Letters Patent is hereby corrected as shown below:

Col. 15, line 31 - delete "(g)"

Col. 15, line 33 - before "measuring" insert ---(g)---

Signed and Sealed this

Eleventh Day of June, 1996

*Attest:*

BRUCE LEHMAN

*Attesting Officer*     *Commissioner of Patents and Trademarks*